United States Patent
Tseng et al.

(10) Patent No.: US 8,753,061 B2
(45) Date of Patent: Jun. 17, 2014

(54) TRANSPORT SYSTEM HAVING MULTILAYER TRACKS AND CONTROLLING METHOD THEREOF

(75) Inventors: Chao-Hsiang Tseng, Taipei County (TW); Huei-Lan Kuo, Taoyuan County (TW)

(73) Assignee: Inotera Memories, Inc., Taoyuan County (TW)

(*) Notice: Subject to any disclaimer, the term of this patent is extended or adjusted under 35 U.S.C. 154(b) by 706 days.

(21) Appl. No.: 13/013,061

(22) Filed: Jan. 25, 2011

(65) Prior Publication Data

US 2012/0114452 A1 May 10, 2012

(30) Foreign Application Priority Data

Nov. 8, 2010 (TW) ................................ 99138358 A

(51) Int. Cl.
*B61B 3/02* (2006.01)
(52) U.S. Cl.
USPC ............ 414/343; 414/940; 198/817; 104/18; 104/91
(58) Field of Classification Search
USPC ............ 414/217.1, 343, 940; 198/466.1, 801, 198/817; 104/18, 91, 94, 129
See application file for complete search history.

(56) References Cited

U.S. PATENT DOCUMENTS

| | | | | | |
|---|---|---|---|---|---|
| 465,198 | A | * | 12/1891 | Patterson et al. | 198/704 |
| 850,173 | A | * | 4/1907 | McMurray | 104/87 |
| 3,459,312 | A | * | 8/1969 | Britcher, Jr. et al. | 414/590 |
| 3,489,101 | A | * | 1/1970 | Kennedy | 104/18 |
| 3,537,489 | A | * | 11/1970 | Hall | 141/137 |
| 3,861,315 | A | * | 1/1975 | Rypinski | 104/18 |
| 4,717,307 | A | * | 1/1988 | Ciuffetelli | 414/300 |
| 7,441,999 | B2 | * | 10/2008 | Nakao et al. | 414/217.1 |
| 7,562,767 | B2 | * | 7/2009 | Trieb | 198/845 |
| 7,887,278 | B2 | * | 2/2011 | Hoshino | 414/217.1 |
| 8,127,687 | B2 | * | 3/2012 | Spangler et al. | 104/89 |
| 8,418,840 | B2 | * | 4/2013 | Trieb | 198/845 |
| 2011/0265680 | A1 | * | 11/2011 | Huguenin et al. | 104/91 |

* cited by examiner

*Primary Examiner* — James Keenan
(74) *Attorney, Agent, or Firm* — Rosenberg, Klein & Lee

(57) ABSTRACT

A transport system having multilayer tracks is presented. The system has a bottom track and at least one top track disposed above on the bottom track. Shuttle carriages are moving along the top and bottom tracks. The shuttle body of each shuttle carriage has a first locking portion on the top end thereof, and has a second locking portion on the bottom end thereof. The second locking portion of the shuttle carriage on the top track can be locked with the first locking portion of the shuttle carriage on the bottom track. Therefore, the two transports on different tracks are locked so that the object can be transported between the top and bottom tracks.

9 Claims, 7 Drawing Sheets

TRANSPORT SYSTEM HAVING MULTILAYER TRACKS AND CONTROLLING METHOD THEREOF

BACKGROUND OF THE INVENTION

1. Field of the Invention

The present invention relates to a transport system having multilayer tracks and a controlling method thereof. In particular, the present invention relates to a transport system that is applied in semiconductor fabrication to improve the transporting efficiency.

2. Description of Related Art

In a semiconductor fabrication plant, production materials are often stored at different manufacturing bays waiting to be processed, or kept at the same manufacturing bay on multiple occasions for undergoing particular fabrication steps. Modern semiconductor fabrication plants typically employ automated transport systems for more precise and efficient transporting of the production materials. The main objective is to assist in moving the production materials to the manufacturing bay, or for moving the treated production materials or end products from the manufacturing bay to a specific storage location. Particularly, transport systems may be used for moving the production materials stored at different storage locations or in between stations.

In traditional, OHT (Overhead Hoist Transport) system is used to transport the production materials and raw materials in the manufacturing bay, for example the production materials and raw materials are transported between storing region and the manufacturing tools. Typically, OHT system usually relies on ceiling rails arranged above the floor of the working area to move shuttle carriages.

On the other hand, OHS (Overhead Shuttle) system provides higher transport-rate and higher transport loading than OHT system. In addition, the height of the ceiling rails of OHS system is usually higher than that of OHT system.

However, in order to transport object between OHS system and OHT system, at least one transferring station (so-called as Stocker), which is similar with the elevator in mechanical characteristics, is installed between the rails of OHS system and OHT system. The transferring station is inadequate for transporting large amount of object because the low transporting efficiency which is resulted from the long transportation passage through the transferring station. Moreover, after transporting the object cross the manufacturing bays, the original shuttle carriage is defined as an empty shuttle carriage. The empty shuttle carriage cannot carry any object until moving back to the original manufacturing bay. In other words, the empty shuttle carriage issue limits the transport loading because the empty shuttle carriage cannot be designated to carry object.

SUMMARY OF THE INVENTION

One particular aspect of the present invention is to provide a transport system having multilayer tracks. By connecting and locking the shuttle carriages on different tracks, the object can be transported between two tracks in different layers. Thus, the transporting efficiency can be improved and the transporting time is decreased.

Another particular aspect of the present invention is to provide a transport method to control the shuttle carriages on different tracks to connect in a designated and efficient position (i.e., a minimum-distance passage a minimum-time passage) for further improving the transporting efficiency.

Still another particular aspect of the present invention is to provide a transport system having multilayer tracks and each of the multilayer tracks can have storing cabinets so that the storing capability of the manufacture can be increased.

The instant disclosure provides a transport system having multilayer tracks and the transport system comprises: a bottom track; at least one top track arranged above the bottom track; a plurality of first and second shuttle carriages respectively traversing on the bottom track and the top track, each of the first and second shuttle carriages including: a shuttle body having at least one opening and a receiving compartment communicating with the opening, wherein the shuttle body has a first locking portion disposed on a top side thereof and a second locking portion disposed on a bottom side thereof; a moving unit connected with the shuttle body, wherein the moving unit corresponds to the bottom track and the top track; and a carrying unit movably disposed in the receiving compartment to access payloads from the receiving compartment; wherein the first locking portion of one of the first shuttle carriages on the bottom track is locked with the second locking portion of one of the second shuttle carriages on the top track such that an object is transported between said one of the first shuttle carriages on the bottom track and said one of the second shuttle carriages on the top track.

The instant disclosure provides a transport method. The transport method includes the steps of:

Step 1 is providing the above-mentioned transport system which is controlled by a control server.

Step 2 is providing a transport signal using a control unit of the control server to the transport system.

Step 3 is providing a connection step according to the transport signal. One of the first shuttle carriages on the bottom track and one of the second shuttle carriages on the top track are connected together in the connection step to form a connected shuttle unit. In this step, the first locking portion of the first shuttle carriage of the connected shuttle unit and the second locking portion of the second shuttle carriage of the connected shuttle unit are locked and connected with each other.

Step 4 is providing a transport step. In this step, the object carried in the connected shuttle unit is transported vertically such that the object is transported between the bottom track and the top track.

The shuttle carriages moving along the different tracks in different heights/layers can be connected with each other and then the carried object can be transported between the different tracks vertically by the connected shuttle carriages. Therefore, the carried object can be transported between the different tracks on selected or any suitable position without the traditional transferring station. As a result, the transporting efficiency can be improved. On the other hand, the shuttle carriages moving along the different tracks can be connected when the transportation is requirement. The transportation is not limited by the location and the number of the traditional transferring station; therefore, the system and the method can meet the requirement of high vertical transportation.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

The present invention provides a transport system having multilayer tracks and a controlling method thereof. The transport system can improve the efficiency for transporting the object, i.e., the manufacturing raw materials, end products, and so forth. Also, the transport system can be applied to decrease the transporting period, in other words, the object can be transported in the shorter path than the traditional system. In addition, the multilayer tracks of the instant transport system can have storing cabinets so that the storing capability can be improved.

Figure 1A:
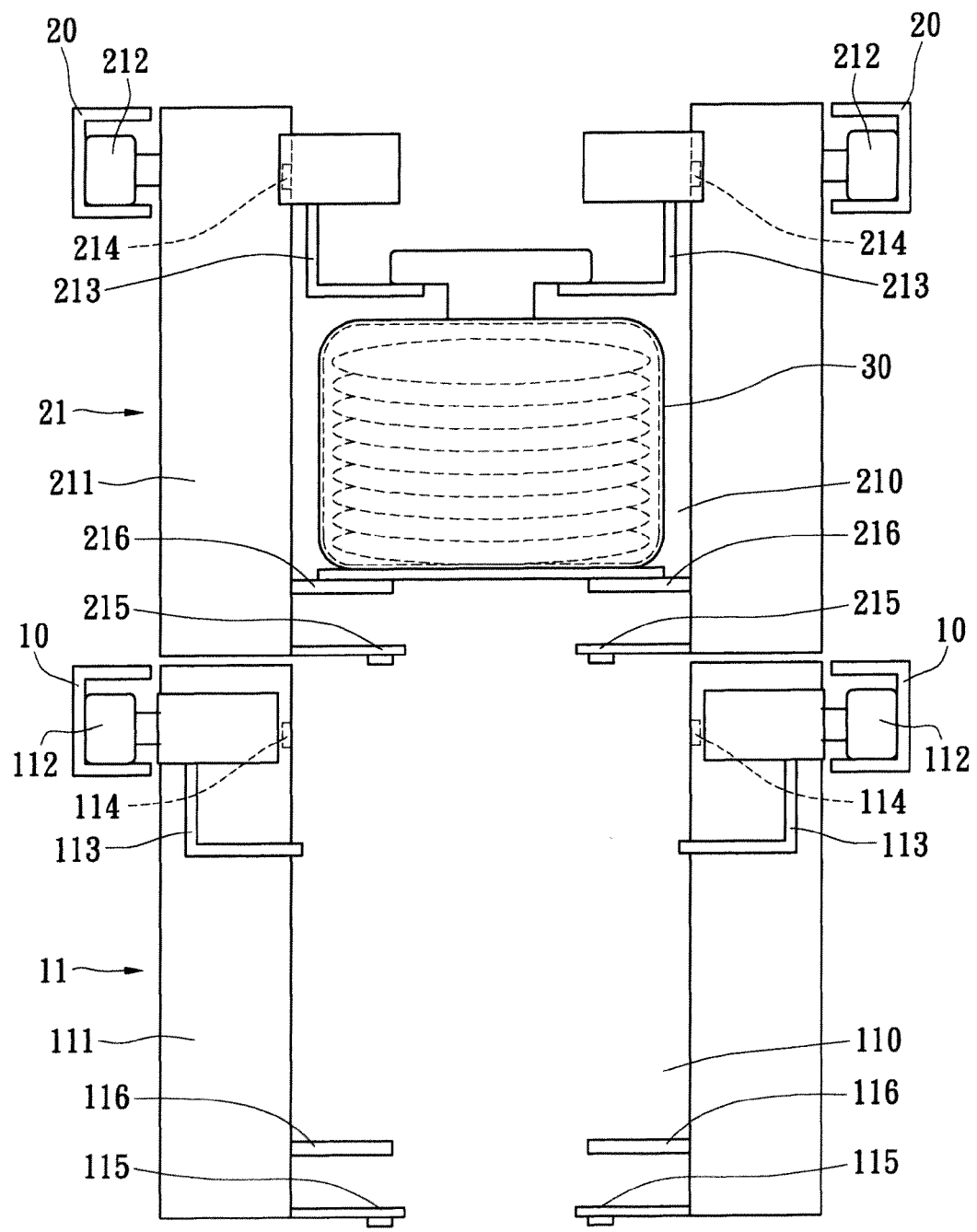
FIGS. 1A to 1F show the transport process to transport a carried object from the top track to the bottom track of the instant disclosure.

Please refer to FIG. 1A; the transport system of the instant disclosure comprises a bottom track 10, at least one top track 20 arranged above the bottom track 10, a plurality of shuttle carriages including first shuttle carriages 11 and second shuttle carriages 21 respectively traversing on the bottom track 10 and the top track 20. In the exemplary embodiment, one top track 20 is disclosed to explain the transport system. Moreover, the bottom track 10 and the top track 20 can be partially different or the same in the path structure.

The first shuttle carriages 11 and second shuttle carriages 21 are substantially similar and the first shuttle carriages 11 are introduced in detail as follow. The first shuttle carriages 11 can traverse on tracks elevated from the and the tracks are belonged to an Overhead Shuttle (OHS) material handling system, Overhead Hoist Transport (OHT) material handling system, but is not restricted to. The first shuttle carriages 11 can be a vehicle, a platform, or the like, that traverses on the ceiling rail of the plant to transport the load such as FOUP (Front Opening Unified Pod). The object 30 can represent any raw materials, material supplies, end products, FOUP, and the like.

Each of the first shuttle carriages 11 includes a shuttle body 111 having at least one opening (i.e., a side opening and a bottom opening) and a receiving compartment 110 communicating with the opening. The object 30 is loaded or unloaded on the receiving compartment 110 through the opening (i.e., side opening). The shuttle body 111 has a first locking portion 114 disposed on a top side thereof and a second locking portion 115 disposed on a bottom side thereof. Furthermore, each of the first shuttle carriages 11 includes a moving unit 112 connected with the shuttle body 111 and a carrying unit 113 movably disposed in the receiving compartment 110. In the exemplary embodiment, the moving unit 112 can be wheels rolling on the bottom track 10 and the carrying unit 113 can be grabbing arm to access payloads from the receiving compartment 110.

Similar with the first shuttle carriages 11, the receiving compartment 210, the shuttle body 211, the moving unit 212, the first locking portion 214 and the second locking portion 215 of the second shuttle carriages 21 are referenced as the foregoing description. Moreover, the first locking portion 114 of the first shuttle carriage 11 corresponds to the second locking portion 215 of the second shuttle carriage 21 so that the first shuttle carriage 11 and the second shuttle carriage 21 can be locked with each other.

Please refer to FIGS. 1A to 1F; the controlling method of the instant disclosure at least comprises the following steps:

Step 1 is providing the foregoing transport system. As above-mentioned, the transport system of the instant disclosure comprises a bottom track 10, at least one top track 20 arranged above the bottom track 10, a plurality of first shuttle carriages 11 and a plurality of second shuttle carriages 21 respectively traversing on the bottom track 10 and the top track 20. In the exemplary embodiment, the object 30 is carried in one of the second shuttle carriage 21 on the top track 20, and the controlling method is used for transporting the object 30 from the one of the second shuttle carriage 21 to one empty first shuttle carriage 11 of the first shuttle carriages 11 on the bottom track 10, but not restricted thereby.

Next step is providing a transport signal using a control unit (not shown) to the transport system. For example, user can input the transport signal by a controlling server having the control unit to send the transport signal to the transport system. According to the transport signal, the object 30 carried in one of the second shuttle carriage 21 on the top track 20 can be transported to one selected first shuttle carriage 11 of the first shuttle carriages 11 on the bottom track 10.

Next step is a connection step, and the selected first shuttle carriage 11 on the bottom track 10 is connected with the corresponding second shuttle carriage 21 on the top track 20 according to the transport signal. In the step, the control unit can control the first shuttle carriage 11 and the second shuttle carriage 21 to move to a predetermined location to perform the connection step to improve the transportation efficiency. For example, the control unit can calculate the distance of the first shuttle carriage 11 and the second shuttle carriage 21 (i.e., analyze the positions of first shuttle carriage 11 and the second shuttle carriage 21) for choosing a minimum-distance passage and then control the first shuttle carriage 11 and the second shuttle carriage 21 to move to a substantial middle location between the first shuttle carriage 11 and the second shuttle carriage 21 along the minimum-distance passage. Alternatively, the control unit can analyze the positions of first shuttle carriage 11, the second shuttle carriage 21 and another shuttle carriage traversing on the bottom track 10 and the top track 20 so as to choose a minimum-time passage and then control the first shuttle carriage 11 and the second shuttle carriage 21 to move to the predetermined location along the minimum-time passage, for example, there has least shuttle carriages on the passage. Further alternatively, user can designate a location via the controlling server with the control unit, and the first shuttle carriage 11 and the second shuttle carriage 21 are controlled to the designated location to perform the connection step. In other words, the control unit can automatically control the first shuttle carriage 11 and the second shuttle carriage 21 to move to the location to perform the connection step according to distance, time, or any other parameters to improve the transportation efficiency, or user can control the first shuttle carriage 11 and the second shuttle carriage 21 depending on the practical requirements.

Figure 1B:
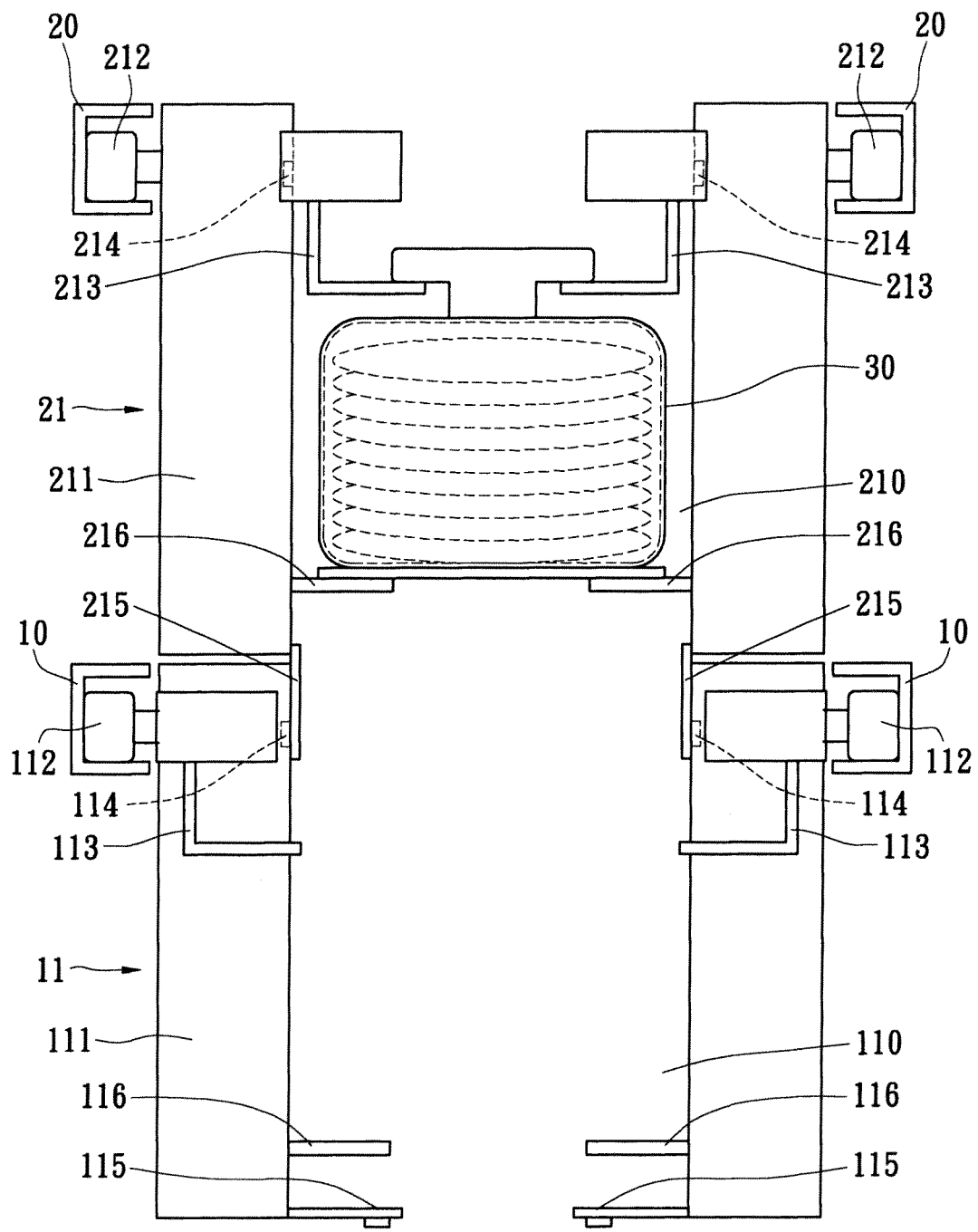

Reference is made to FIG. 1B and an exemplary method of connecting the first shuttle carriage 11 and the second shuttle carriage 21 is shown. In the connection step (e.g., the first shuttle carriage 11 and the second shuttle carriage 21 arrive to the predetermined location), the selected first shuttle carriage 11 on the bottom track 10 and the corresponding second shuttle carriage 21 on the top track 20 are connected together to form a connected shuttle unit while the first locking portion 114 of the first shuttle carriage 11 of the connected shuttle unit and the second locking portion 215 of the second shuttle carriage 21 of the connected shuttle unit are locked and connected with each other. In other words, the first locking portion 114 and the second locking portion 215 are mated with each other so that the first shuttle carriage 11 and the second shuttle carriage 21 can be structurally and firmly locked and connected with each other. In the exemplary embodiment, the second locking portion 215 (115) can be locking arms pivoted on the bottom side of the shuttle body 211 (111) and the locking arms respectively have at least one protrusion thereon. The first locking portion 114 (214) can be locking ports, for example locking holes, formed on the top side of the shuttle body 111 (211). In the connection step, the locking arms can rotate from a horizontal position to a vertical position and then be locked and connected to the locking ports. As a result, the selected first shuttle carriage 11 on the bottom track 10 and the corresponding second shuttle carriage 21 on the top track 20 can be connected with each other. In more detail explanation, the locking arms pivotedly rotate so that the protrusions on the locking arms can be mated with the locking holes. Thus, the selected first shuttle carriage 11 on the bottom track 10 and the corresponding second shuttle carriage 21 on the top track 20 can be locked to each other in a stable state to form a connected shuttle unit and the object 30 can be transported from the second shuttle carriage 21 to the first shuttle carriage 11.

Furthermore, while the connection step, the connected shuttle unit of the first shuttle carriage 11 and the corresponding second shuttle carriage 21 can stop in the connected location, e.g., the location to perform the connection step. Alternatively, the connected shuttle unit of the first shuttle carriage 11 and the corresponding second shuttle carriage 21 can move along the tracks. In the case that the bottom track 10 and the top track 20 are entirely the same in the path structure, the connected shuttle unit of the first shuttle carriage 11 and the corresponding second shuttle carriage 21 can move along the path structure of the bottom track 10, i.e., the top track 20. On the other hand, in the case that the bottom track 10 and the top track 20 are partially the same in the path structure, the control unit can control the connected shuttle unit of the first shuttle carriage 11 and the corresponding second shuttle carriage 21 to move along the same part of the path structure.

Figure 1C:
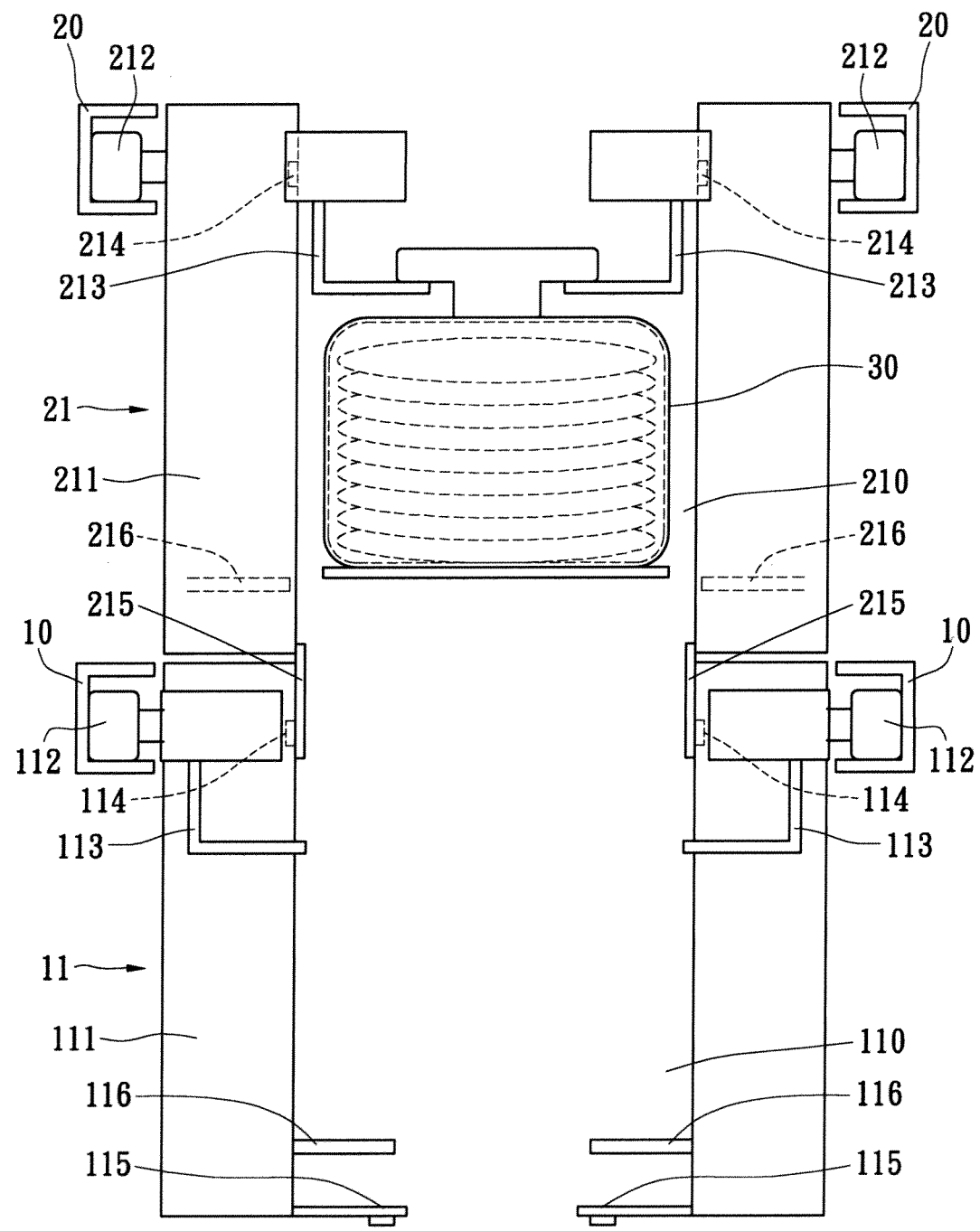
Figure 1D:
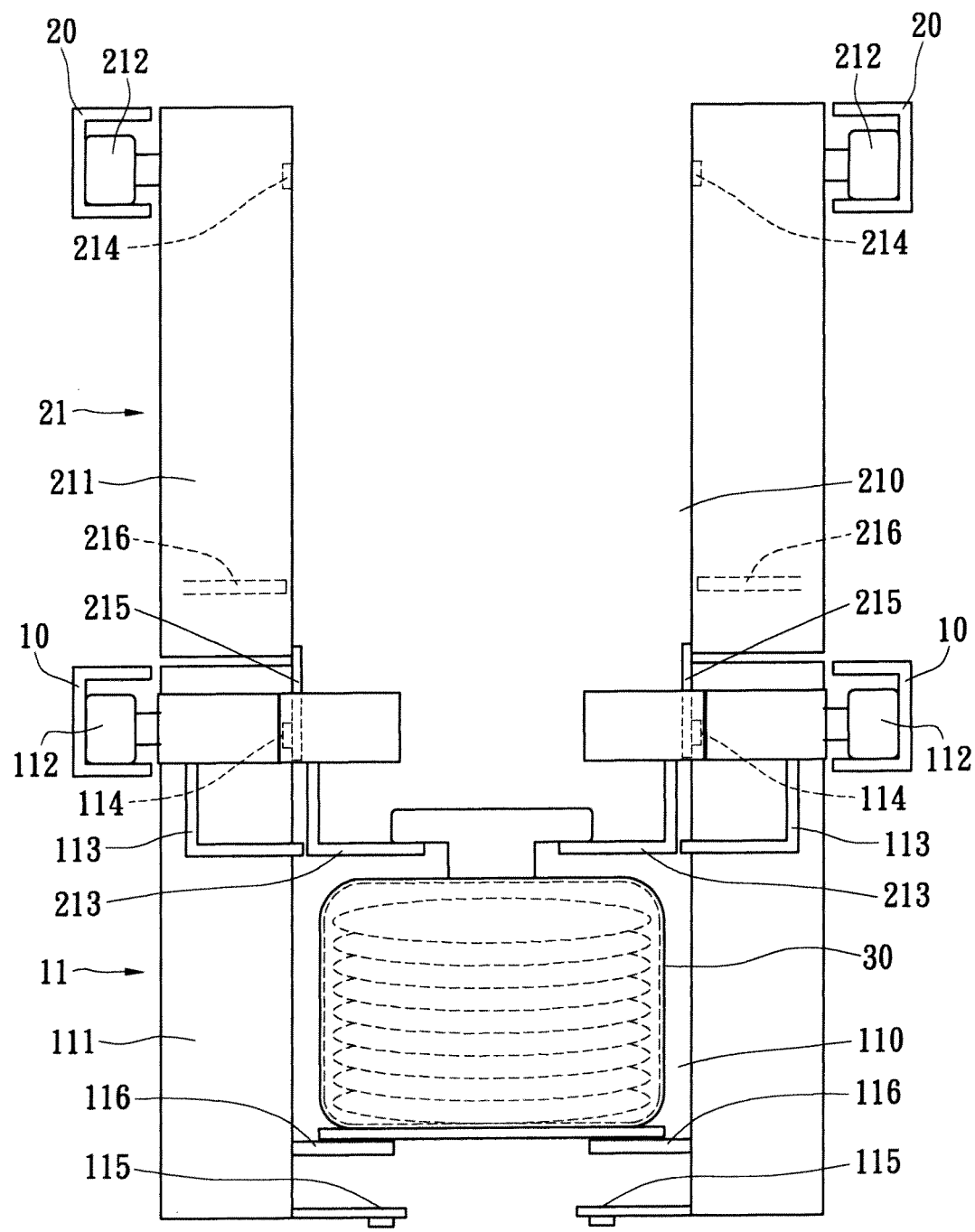

Reference is made to FIG. 1D, the next step is a transport step and the object 30 carried in the connected shuttle unit is transported vertically from one shuttle carriage of the connected shuttle unit to the other. Therefore, the object 30 can be transported between the bottom track 10 and the top track 20. In the exemplary embodiment, the object 30 carried in the second shuttle carriage 21 along the top track 20 is transported to the first shuttle carriage 11 along the bottom track 10, but not restricted thereby. In the beginning, the object 30 is carried by the carrying unit 213 of the second shuttle carriage 21 of the connected shuttle unit. While the transport step, the carrying unit 213 with the carried object 30 is transported from the second shuttle carriage 21 of the connected shuttle unit to the first shuttle carriage 11 of the connected shuttle unit. As shown in FIG. 1D, the carrying unit 213 with the carried object 30 move downward to the receiving compartment 110 of the first shuttle carriage 11 so that the carried object 30 is transported vertically from the top track 20 to the bottom track 10. Alternatively, the carried object 30 can be transported vertically from the bottom track 10 to the top track 20. Thus, the carried object 30 can be transported vertically between the bottom track 10 and the top track(s) 20. Accordingly, the object 30 can be vertically transported in any suitable position along the bottom track 10 and the top track 20 so that the transportation efficiency can be improved.

Please refer to FIG. 1C; each the shuttle carriage 11, 21 can further have a support member 116, 216 disposed on a lower portion of the shuttle body 111, 211. Before the transport step, the support member 116, 216 can be position-translated from a close position to an open position. In the exemplary embodiment, the support member 216 is located at the close position, i.e., a supporting position to protect the object 30 carried in the second shuttle carriage 21 during the ordinary transportation along the top track 20. When the control unit provides the transport signal, the support member 216 is position-translated to an open position before the transport step so that the object 30 can be vertically transported from the second shuttle carriage 21 to the first shuttle carriage 11. In other words, the support member 216 is originally protruded inwardly from the inner side surface of the shuttle body 211 and is controlled to move or slide into the side wall of the shuttle body 211. Thus, the carrying unit 213 with the carried object 30 can move to the receiving compartment 110 of the first shuttle carriage 11 through the bottom opening. Moreover, the transported object 30 in the first shuttle carriage 11 are protected by the support member 116 in the close position during the transport step.

Figure 1E:
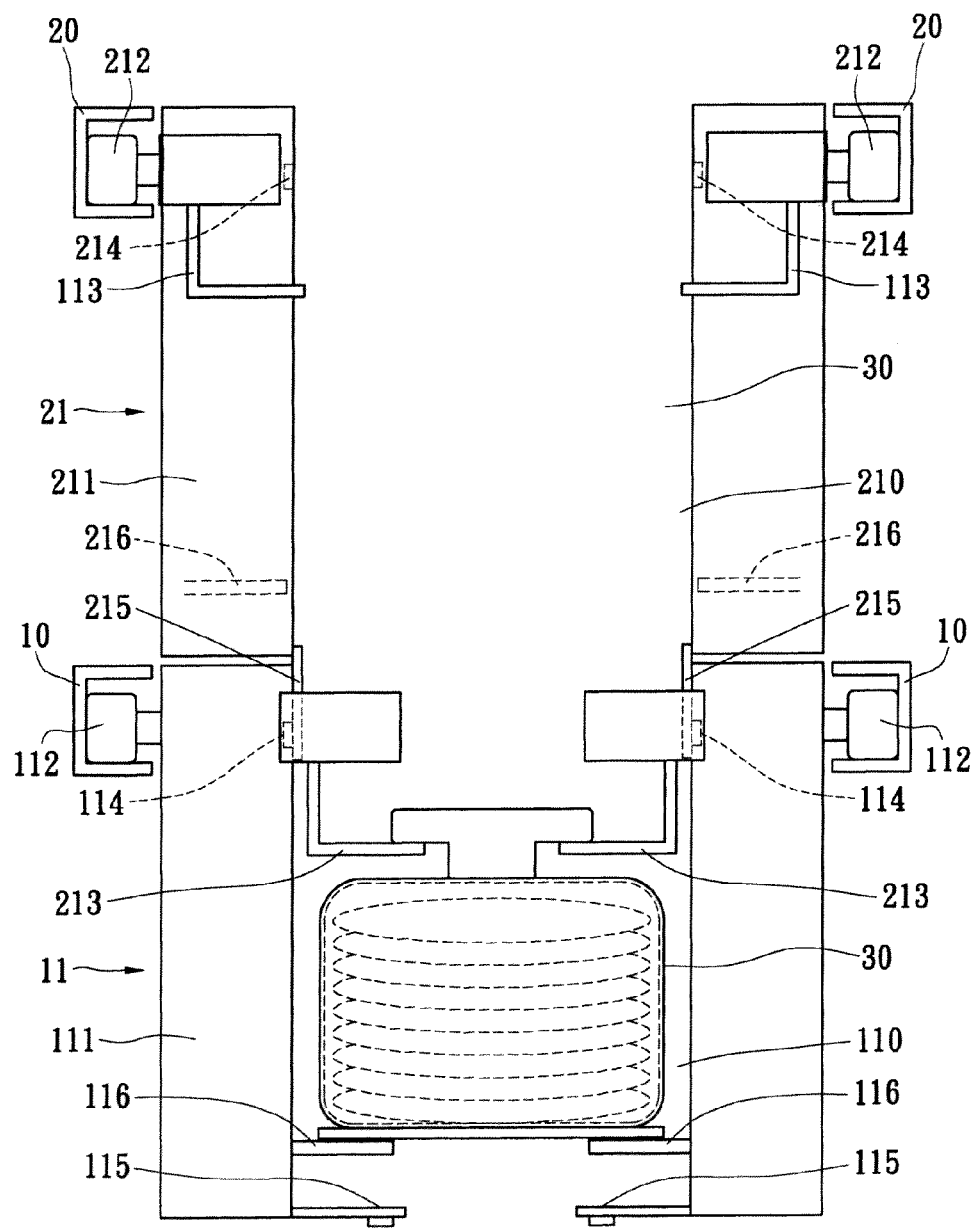
Figure 1F:
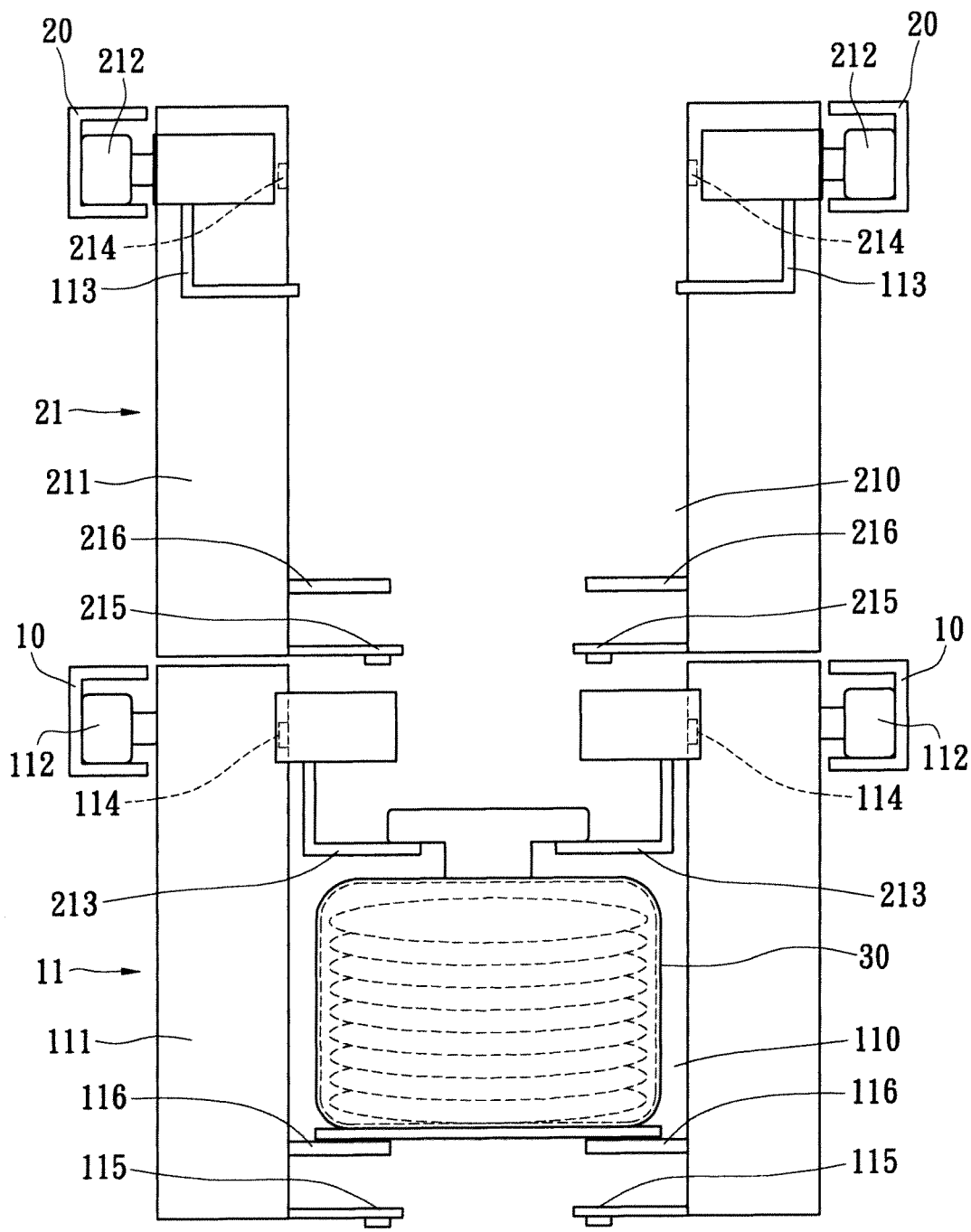

Please refer to FIG. 1E, the carrying unit 113 which does not carrying the object 30 is transported to the second shuttle carriage 21 which originally carry the object 30 after the transport step. In the exemplary embodiment, the carrying unit 213 with the carried object 30 move downward to the first shuttle carriage 11 and then the carrying unit 113 which does not carrying the object 30 moves to the second shuttle carriage 21 upward through the shuttle bodies 111, 211. For example, the carrying unit 113, 213 can be transported by sliding groove or chain. In other words, the carrying unit 113, 213 can be switched with each other after the transport step. Moreover, the second shuttle carriage 21 and the first shuttle carriage 11 still respectively have the carrying unit 113, 213 after the transport step and they can used for another transport. On the other hand, after the transport step, the second locking portion 215 and the first locking portion 114 can be released from each other so that the connected shuttle unit is separated into the original first shuttle carriage 11 and second shuttle carriage 21.

On the other hand, the transport system further has a plurality of storing cabinets 40 (i.e., ZFB, Zero Footprint Buffer: a frame structure that is hanged under the track and capable of storing FOUP) connected to the bottom track 10, and has a plurality of storing cabinets 40 connected to the top track 20. Comparing with the traditional transporting system, the storing cabinets 40 can be installed near the bottom track 10 to the top track 20 so as to increase the capability of storing object 30. In other words, because the bottom track 10 to the top track 20 are built in different heights, the storing cabinets 40 installed near the bottom track 10 to the top track 20 provides more storing capability than the traditional transporting system which only has one track. Moreover, the instant controlling method further comprises a load/unload step for providing a load/unload signal using the control unit to the transport system, and the first shuttle carriages 11 load/unload the object 30 on the storing cabinets 40 connected to the bottom track 10 or/and the second shuttle carriages 21 load/unload the object 30 on the storing cabinets 40 connected to the top track 20 in the load/unload step. To sum up, the shuttle carriages 11, 21 can load the objects 30 to the corresponding storing cabinets 40 or unload the objects 30 from the corresponding storing cabinets 40.

Figure 2:
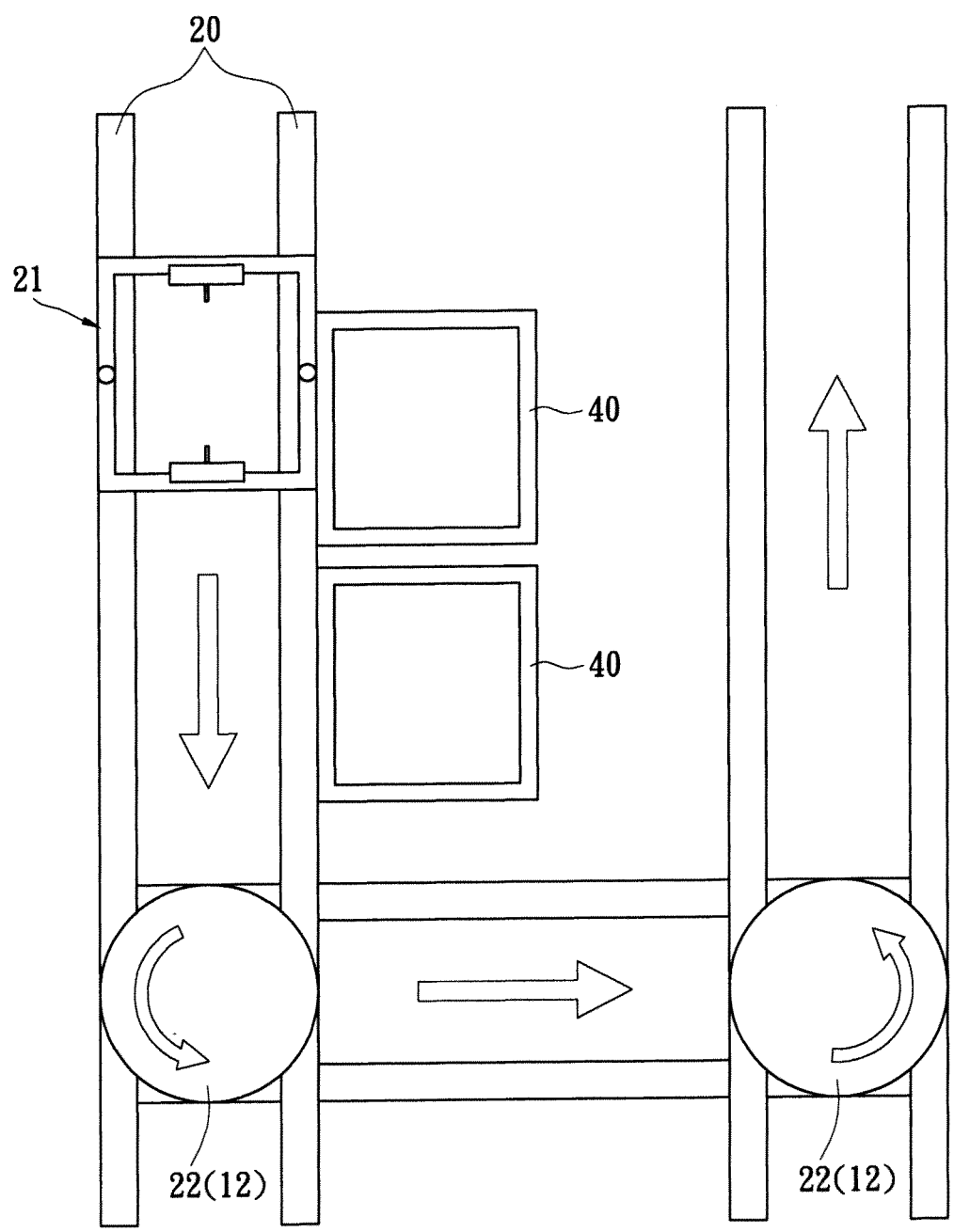
FIG. 2 is a top-view diagram of the transport system of the present invention (the bottom track shall not be seen due to the view angle).

On the other hand, FIG. 2 shows the top view of the transport system. Due to the view angle, the second shuttle carriage 21 and the top track 20 are shown. In the exemplary embodiment, one of the second shuttle carriage 21 moves along two rails of the top track 20. The top track 20 can have rotation disks 22 on the corners thereof to turn the second shuttle carriage 21. Similarly, the bottom track 10 also can have rotation disks 12 so that the first shuttle carriages 11 can move in different directions. However, the bottom track 10 and the top track 20 can have any additional mechanical installation to control the movement of the shuttle carriages 11, 21, for example, the railroad switch can be used to guide the shuttle carriages 11, 21 from one track to another for changing the moving direction of the shuttle carriages 11, 21.

To sum up, the shuttle carriages moving along the different tracks in different heights/layers can be connected with each other and then the carried object can be transported between the different tracks vertically by the connected shuttle carriages. Therefore, the carried object can be transported between the different tracks on selected or any suitable position without the traditional transferring station. As a result, the transporting efficiency can be improved.

The present invention has the following characteristics.

1. The transport system of the present invention has multilayer tracks (i.e., the bottom and the top tracks) and each of the tracks can connect to individual storing cabinets so that the storing capability is increased. Moreover, the traditional transferring station is omitted for saving the space of the manufacture plant, e.g., FAB.

2. The problem of loading limitation resulted from empty shuttle carriages when the object is transported cross manufacturing area (i.e., manufacturing BAY) is solved. In other words, the issue of empty shuttle carriages does not occur in the transport system of the present invention.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A transport system having multilayer tracks, the transport system applied for a semiconductor manufacturing process, the transport system comprising:
a bottom track;
at least one top track arranged above the bottom track; and
a first shuttle carriage and a second shuttle carriage respectively traversing on the top track and the bottom track, each of the first and second shuttle carriages including:
a shuttle body having at least one opening and a receiving compartment communicating with the opening, wherein the shuttle body has a locking arm pivotally connected to a bottom inner side thereof and a fastening hole defined on a top inner side thereof, and wherein the locking arm has an integrally formed protrusion protruding therefrom configured to aligningly engage with the fastening hole;
a moving unit connected with the shuttle body, wherein the moving unit corresponds to the bottom track and the top track; and
a carrying unit movably disposed in the receiving compartment to access payloads from the receiving compartment;
a retractable support member disposed on an inner lower portion of the shuttle body;
wherein the locking arm of the first shuttle carriage on the top track is configured to rotate from a horizontal position to a vertical position, and the protrusion of the locking arm is configured to directly engage in the corresponding fastening hole of the second shuttle carriage on the bottom track to form a connected shuttle unit;
wherein the carrying unit of one of the first and second shuttle carriages is configured to reciprocatingly move between the first and second shuttle carriages of the connected shuttle unit to transport an object between the bottom and upper tracks;
wherein the retractable support member is configured to position-translate between a close position and an open position to selectively support the object.

2. The transport system as claimed in claim 1, wherein the transport system further has a plurality of storing cabinets connected to the bottom track, and has a plurality of storing cabinets connected to the top track.

3. A controlling method of a transport system having multilayer tracks, the controlling method of the transport system applied for semiconductor manufacturing, comprising the following steps:
providing a transport system, the transport system comprising:
a bottom track;
at least one top track arranged above the bottom track; and
a plurality of first and second shuttle carriages respectively traversing on the bottom track and the top track, each of the first and second shuttle carriages including:
a shuttle body having at least one opening and a receiving compartment communicating with the opening, wherein the shuttle body has a locking arm pivotally connected to a bottom side thereof and a fastening hole defined on a top side thereof, and wherein the locking arm has a integrally formed protrusion protruding therefrom configured to aligningly engage with the fastening hole;
a moving unit connected with the shuttle body, wherein the moving unit corresponds to the bottom track and the top track;
a carrying unit movably disposed in the receiving compartment to access payloads from the receiving compartment; and
a support member disposed on a lower portion of the shuttle body;
providing a transport signal using a control unit to the transport system;
providing a connection step according to the transport signal, wherein one of the first shuttle carriages on the bottom track and one of the second shuttle carriages on the top track are connected together in the connection step to form a connected shuttle unit, and wherein the locking arm of the first shuttle carriage of the connected shuttle unit and the fastening hole of the second shuttle carriage of the connected shuttle unit are locked and connected with each other;
position-translating the support member from a close position to an open position; and
providing a transport step, wherein the object carried in the connected shuttle unit is transported vertically such that the object is transported between the bottom track and the top track.

4. The controlling method as claimed in claim 3, wherein in the transport step, the object is carried by the carrying unit of the second shuttle carriage of the connected shuttle unit, and the carrying unit with the object is transported from the second shuttle carriage of the connected shuttle unit to the first shuttle carriage of the connected shuttle unit.

5. The controlling method as claimed in claim 4, wherein after the transport step, the carrying unit of the first shuttle carriage of the connected shuttle unit moves to the second shuttle carriage of the connected shuttle unit.

6. The controlling method as claimed in claim 3, wherein in the transport step, the object is carried by the carrying unit of the first shuttle carriage of the connected shuttle unit, and the carrying unit with the object is transported from the first shuttle carriage of the connected shuttle unit to the second shuttle carriage of the connected shuttle unit.

7. The controlling method as claimed in claim 6, wherein after the transport step, the carrying unit of the second shuttle carriage of the connected shuttle unit moves to the first shuttle carriage of the connected shuttle unit.

8. The controlling method as claimed in claim 3, wherein the transport system further has a plurality of storing cabinets connected to the bottom track, and the controlling method further comprises a load/unload step for providing a load/unload signal using the control unit to the transport system, and in the load/unload step:
- the first shuttle carriages load/unload the object on the storing cabinets connected to the bottom track.

9. The controlling method as claimed in claim 3, wherein the transport system further has a plurality of storing cabinets connected to the top track, and the controlling method further comprises a load/unload step for providing a load/unload signal using the control unit to the transport system, and in the load/unload step:
- the second shuttle carriages load/unload the object on the storing cabinets connected to the top track.

\* \* \* \* \*